(12) United States Patent
Inoue

(10) Patent No.: US 8,872,537 B2
(45) Date of Patent: Oct. 28, 2014

(54) SEMICONDUCTOR INTEGRATED CIRCUIT, CIRCUIT TESTING SYSTEM, CIRCUIT TESTING UNIT, AND CIRCUIT TEST METHOD

(75) Inventor: Hiroaki Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 234 days.

(21) Appl. No.: 13/256,583

(22) PCT Filed: Apr. 9, 2010

(86) PCT No.: PCT/JP2010/056799
§ 371 (c)(1),
(2), (4) Date: Sep. 14, 2011

(87) PCT Pub. No.: WO2010/134403
PCT Pub. Date: Nov. 25, 2010

(65) Prior Publication Data
US 2012/0049883 A1      Mar. 1, 2012

(30) Foreign Application Priority Data
May 20, 2009   (JP) .................................. 2009-122048

(51) Int. Cl.
*G01R 31/02* (2006.01)
*G01R 31/3187* (2006.01)
*G01R 31/317* (2006.01)

(52) U.S. Cl.
CPC ........ *G01R 31/3187* (2013.01); *G01R 31/3172* (2013.01)
USPC ................. 324/762.01; 324/750.15; 702/120; 702/122

(58) Field of Classification Search
CPC ............... G01R 31/318547; G01R 31/318335; G01R 31/318558; G06F 11/263
USPC .................................. 324/762.01, 750.15, 537
See application file for complete search history.

(56) References Cited

U.S. PATENT DOCUMENTS

| 6,762,617 | B2 * | 7/2004 | Iwase et al. ...................... 326/11 |
| 7,236,633 | B1 * | 6/2007 | Lewis et al. ..................... 382/233 |
| 2007/0047343 | A1 * | 3/2007 | Adams et al. ................. 365/200 |

(Continued)

FOREIGN PATENT DOCUMENTS

| JP | 1-200460 A | 8/1989 |
| JP | 2002190527 A | 7/2002 |
| JP | 2004156976 A | 6/2004 |
| JP | 2006322931 A | 11/2006 |

OTHER PUBLICATIONS

English translation of JP 2004-156976 filed by applicant.*

(Continued)

*Primary Examiner* — Jermele M Hollington
*Assistant Examiner* — Dustin Dickinson
(74) *Attorney, Agent, or Firm* — Sughrue Mion, PLLC

(57) ABSTRACT

This invention has an object of providing a semiconductor integrated circuit enabling further reduction of the number of test terminals without depending on a compression/expansion technique alone. The semiconductor integrated circuit of the invention is connected to a terminal group used to exchange test information of a circuit to be tested, and comprises a utilization device which utilizes, when reading a test result, a terminal subgroup of the terminal group, which is not used to transmit information required to read the test result, to receive the test result from the circuit to be tested.

13 Claims, 11 Drawing Sheets

(56) References Cited

U.S. PATENT DOCUMENTS

2007/0279259 A1* 12/2007 Hijikuro .................... 341/50
2008/0077831 A1* 3/2008 Sasaki et al. ................ 714/720
2008/0288230 A1* 11/2008 Fernsler et al. .............. 703/14
2009/0113261 A1* 4/2009 Kajihara et al. ............. 714/724
2010/0244848 A1* 9/2010 Barrenscheen et al. ...... 324/500
2012/0030377 A1* 2/2012 Inoue ........................ 709/247

OTHER PUBLICATIONS

International Search Report for PCT/JP2010/056799 mailed May 25, 2010.

* cited by examiner

| 00 | 4-BIT DATA WITHOUT CODE EXTENSION |
|----|-----------------------------------|
| 01 | 8-BIT DATA WITHOUT CODE EXTENSION |
| 10 | 16-BIT DATA WITHOUT CODE EXTENSION |
| 11 | 32-BIT DATA WITHOUT CODE EXTENSION |

3000

| 000 | ALL ZERO |
|-----|----------|
| 001 | 4-BIT DATA WITHOUT CODE EXTENSION |
| 010 | 0x0α0β |
| 011 | 0xα0β0 |
| 100 | 8-BIT DATA WITHOUT CODE EXTENSION |
| 101 | 8-BIT ZERO PADDED DATA |
| 110 | DATA WITH EQUAL HIGH- AND LOW-ORDER BYTES |
| 111 | 16-BIT DATA WITHOUT CODE EXTENSION |

SEMICONDUCTOR INTEGRATED CIRCUIT, CIRCUIT TESTING SYSTEM, CIRCUIT TESTING UNIT, AND CIRCUIT TEST METHOD

TECHNICAL FIELD

This invention relates to a semiconductor integrated circuit, a circuit testing system, a circuit testing unit, and a circuit test method.

BACKGROUND ART

Performance tests for semiconductor integrated circuits, such as reconfigurable devices represented by FPGAs (Field Programmable Gate Arrays), are generally performed by conducting a writing write test in which information (configuration information) comprising an address and data is written into a circuit to be tested, and reading the configuration information corresponding to a test result.

Recent sophistication of circuits to be tested has created a tendency of increase in the number of contact pins used to connect between a circuit testing unit and a circuit to be tested, which results in increased testing cost.

In order to reduce the testing cost, it is desired to reduce the number of contact pins used to connect a testing circuit and a circuit to be tested.

Known methods to reduce the number of contact pins between a testing circuit and a circuit to be tested include those employing a compression/expansion technique.

For example, Japanese Laid-Open Patent Publication No. 2006-322931 (Patent Document 1) discloses a configuration in which a test pattern, which has previously been compressed so as to be expandable in real time, is loaded by an inspection device and stored in a pattern memory. A frame processor expands the test pattern and a pulse shape is applied to a LSI based on the expanded data.

DISCLOSURE OF THE INVENTION

However, according to the invention disclosed in Patent Document 1, the data (output signal) obtained by reading the test result is output by a pin electronics directly to the frame processor.

Accordingly, the number of terminals is determined according a number of bits required to transmit the data during writing, and hence it is difficult to further reduce the number of terminals.

This means that it is difficult to further reduce the number of test terminals by utilization of a compression/expansion technique alone.

This invention has been made in view of the problem described above, and it is an object of the invention to provide a semiconductor integrated circuit which enables reduction of the number of terminals without depending on a compression/expansion technique alone.

In order to solve the aforementioned problem, a first aspect of this invention provides a semiconductor integrated circuit connected to a terminal group for exchange of test information of a circuit to be tested, and comprising a utilization device which utilizes, when reading a test result, a terminal subgroup in the terminal group, which is not used to transmit information required to read the test result, to receive the test result from the circuit to be tested.

A second aspect of this invention provides a circuit testing system including: a circuit testing unit comprising a first terminal group used to transmit information for requesting transmission of a test result of a circuit to be tested, a second terminal group used to receive the test result, and a controller for controlling exchange of the information using the first terminal group and the second terminal group; and a first expansion unit for receiving the information for requesting transmission of the test result via a third terminal group which forms part of the first terminal group, expanding the received information, and transmitting the expanded information to the circuit to be tested. The controller receives the test result from the circuit to be tested via a fourth terminal group which is a terminal subgroup of the first terminal group which is not utilized by the first expansion unit.

A third aspect of this invention provides a circuit testing unit including: a first terminal group used to transmit result request information for requesting a test result of a circuit to be tested; a second terminal group used to receive the test result of the circuit to be tested; and a controller for receiving the test result from the circuit to be tested via the terminal subgroup of the first terminal group which is not utilized to transmit the result request information.

A fourth aspect of this invention provides a circuit test method characterized by using in common a first terminal group used to transmit result request information requesting a test result of a circuit to be tested and a second terminal group used to receive the test result of the circuit to be tested, and utilizing a terminal subgroup of the first terminal group, which is not been utilized to transmit the result request information, to receive the test result from the circuit to be tested.

ADVANTAGEOUS EFFECT OF THE INVENTION

Thus, this invention is able to provide a semiconductor integrated circuit enabling further reduction of the number of test terminals without depending on the compression/expansion technique alone.

BRIEF DESCRIPTION OF THE DRAWINGS

FIG. 11 is a diagram illustrating an example of compression rules 110*h*.

LIST OF REFERENCE NUMERALS

Figure 1:
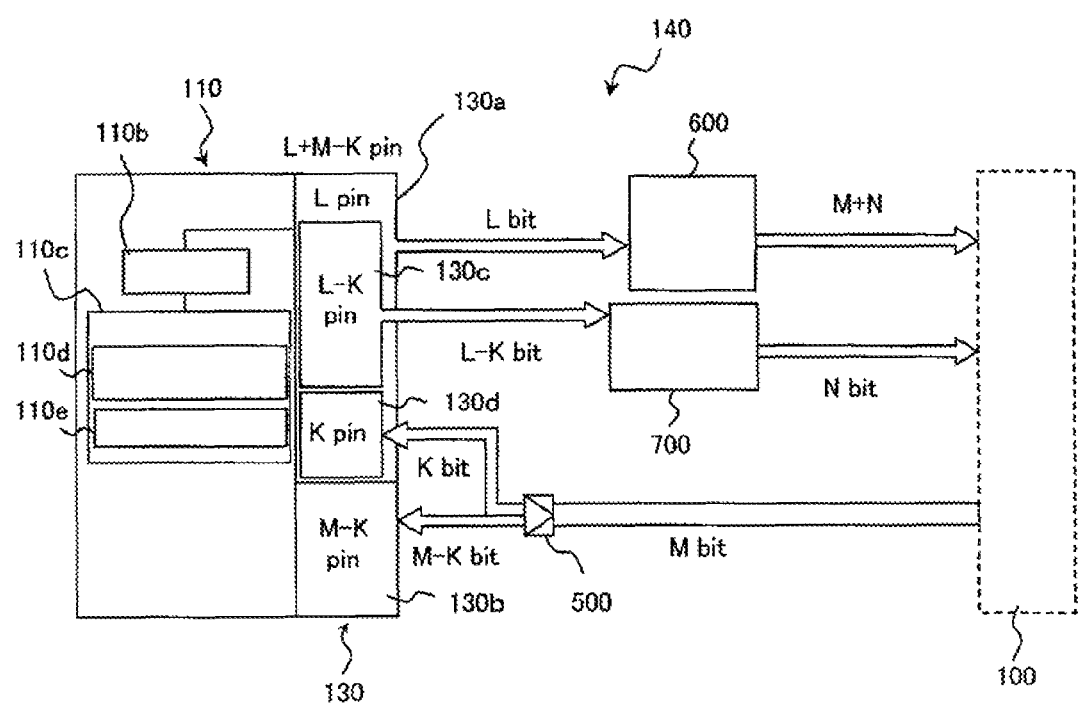
FIG. 1 is a block diagram schematically illustrating a circuit testing system 140 according to this invention.

100 Circuit to be tested
110 Circuit testing unit
110*b* Controller
130 Terminal group 130a First terminal group
130b Second terminal group
130c Third terminal group
130d Fourth terminal group
140 Circuit testing system
600 Address/data expansion circuit
700 Address expansion circuit

BEST MODE FOR CARRYING OUT THE INVENTION

An exemplary preferred embodiment of this invention will be described with reference to the drawings.

Referring to FIGS. 1 to 5, a configuration of a circuit testing system 140 and a test method using this system according to an embodiment of this invention will be schematically described.

A system for testing a reconfigurable device represented by a FPGA is shown here as an example of the circuit testing system 140.

Firstly, a configuration of this system will be schematically described with reference to FIGS. 1 to 3.

Figure 2:
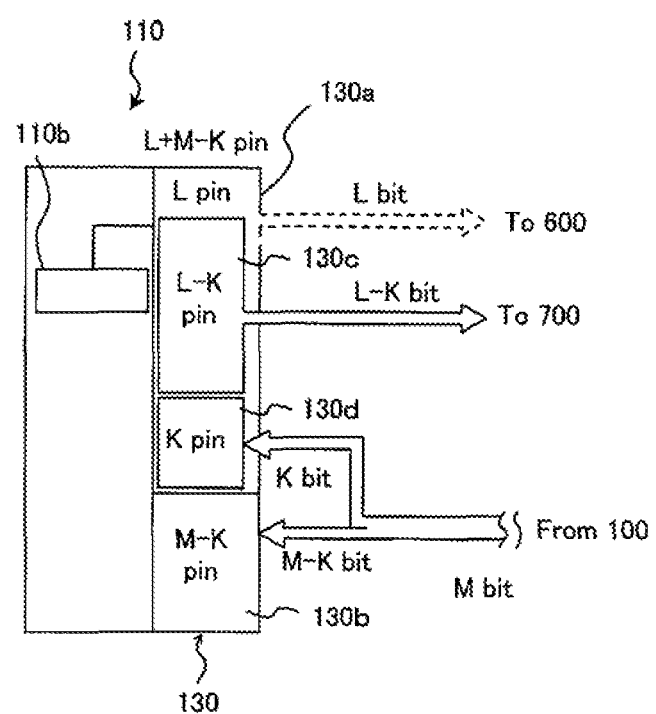
FIG. 2 is a diagram schematically illustrating a circuit testing unit 110.
Figure 3:
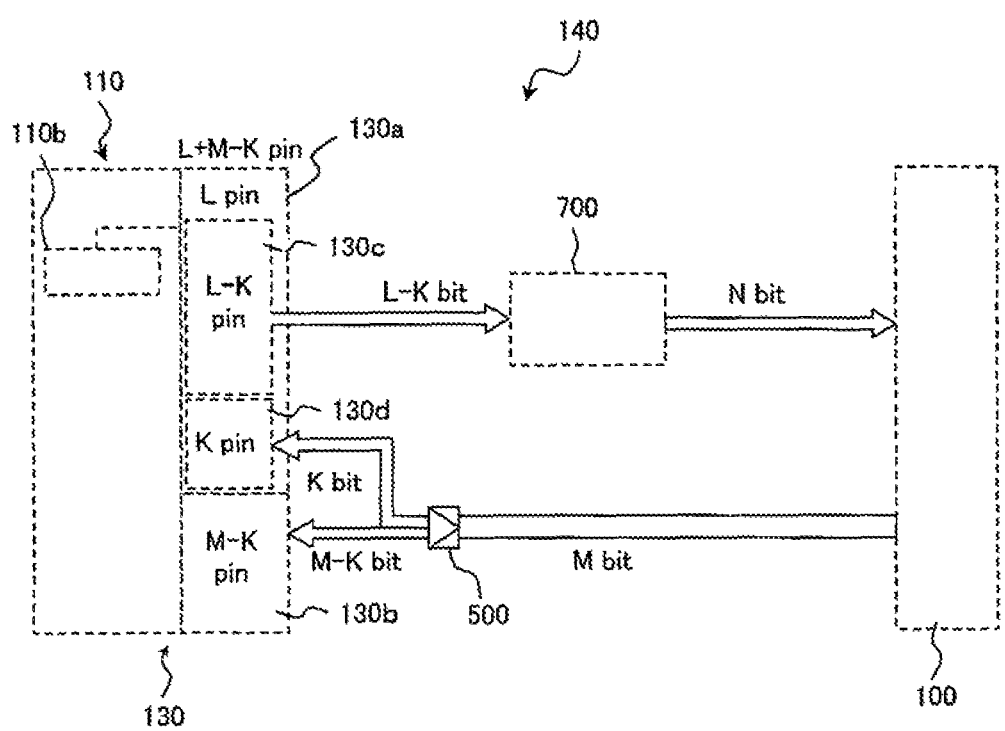
FIG. 3 is a block diagram illustrating a portion of the circuit testing system 140 relating to reading.

As shown in FIGS. 1 to 3, the circuit testing system 140 comprises a circuit testing unit 110 for testing a circuit to be tested 100.

The circuit testing system 140 further comprises an address expansion circuit 700, as a first expansion unit, for expanding compressed read information 110e (to be described later), that is information requesting a test result (which is compressed, also referred to as first compressed information, or result request information).

The circuit testing system 140 further comprises a dividing circuit 500 for dividing read data as a utilization device (dividing device).

The circuit testing system 140 further comprises a address/data expansion circuit 600, as a second expansion device, for expanding information obtained by compressing information for a (write) test (compressed write information 110d, second compressed information, testing information).

The circuit testing unit 110 comprises a terminal group 130 used to exchange information between the circuit testing unit 110 and the circuit to be tested 100.

The address/data expansion circuit 600, the address expansion circuit 700, and the dividing circuit 500 together form a semiconductor integrated circuit, for example.

The terminal group 130 includes a first terminal group 130a mainly used for (assigned to) transmission of the compressed read information 110e (and transmission of the compressed write information 110d), and a second terminal group 130b mainly used for (assigned to) reception of read data that is a test result.

The circuit testing unit 110 further comprises a controller 110b (compression unit) for controlling exchange of information using the terminal group 130 (the first terminal group 130a and the second terminal group 130b), and for compressing write or read information.

The circuit testing unit 110 further comprises a storage unit 110c. The storage unit 110c comprises compressed write information 110d obtained by compressing information for write test, and compressed react information 110e obtained by compressing read address 110g (to be described later).

Next, testing procedures using the circuit testing system 140 will be schematically described with reference to FIGS. 1 to 5.

First of all, the most characteristic features of this invention will be described, particularly referring to FIG. 4.

Figure 4:
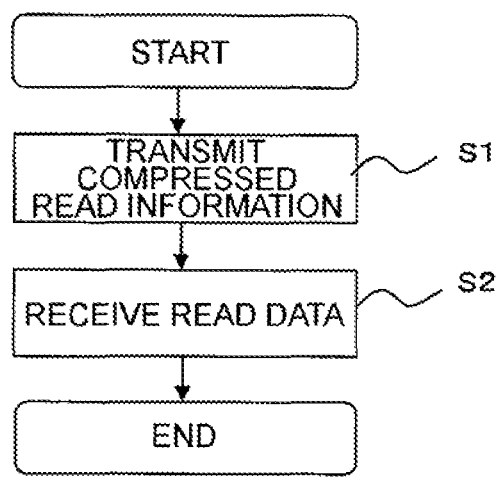
FIG. 4 is a flowchart schematically illustrating a test conducted using the circuit testing system 140.

The controller 110b transmits information requesting transmission of a test result to the circuit to be tested 100 via the third terminal group 130c (S1 in FIG. 4). More specifically, the compressed read information 110e that is first compressed information obtained by compressing the read address 110g is transmitted to the address expansion circuit 700 via the third terminal group 130c that is part of the first terminal group 130a, and the compressed read information 110e is expanded by the address expansion circuit 700 and transmitted to the circuit to be tested 100.

The controller 110b then receives a test result, that is specifically read data corresponding to the read address 110g, from the circuit to be tested 100 via the terminal group 130 (S2 in FIG. 4).

The dividing circuit 500 divides the read data, and the controller 110b receives divided read data, as shown in FIGS. 1 to 3, via the second terminal group 130b and a fourth terminal group 130d which is a terminal subgroup in the first terminal group 130a that has not been used to transmit the compressed read information 110e.

As described above, the circuit testing system 140 is configured to use part of the first terminal group 130a in common for transmission of the compressed read information 110e and reception of the read data by means of the dividing circuit 500.

Therefore, using the circuit testing system 140, the number of testing terminals can be reduced in comparison with a prior art system, without depending on the compression/expansion technique alone.

Next, the testing procedures as a whole will be schematically described with reference to FIG. 5.

Figure 5:
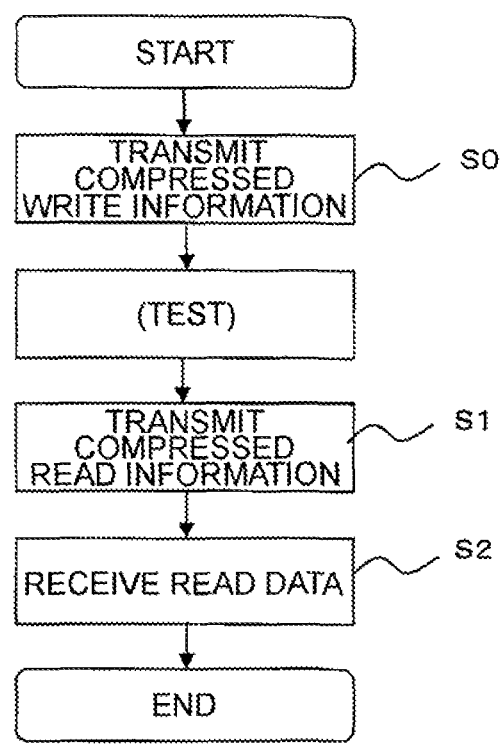
FIG. 5 is a flowchart schematically illustrating a test conducted using the circuit testing system 140.

The controller 110b transmits the compressed write information 110d as second compressed information that is information for a test to the circuit to be tested 100 by means of the first terminal group 130a (L terminals) (S0 in FIG. 5). The compressed write information 110d is information obtained by compressing (M+N)-bit write address/data 110f into L bits. The compressed write information 110d is transmitted to the circuit to be tested 100 after being expanded to M+N bits (M bits for data and N bits for address) by the address expansion circuit 700.

The circuit to be tested 100 conducts a test, using this received write address/data 110f.

Next, the controller 110b transmits the compressed read information 110e to the address expansion circuit 700 by means of the third terminal group 130c (L−K terminals) that is part of the first terminal group 130a (S1 in FIG. 5). The compressed read information 110e here is information obtained by compressing N-bit read address 110g into L−K bits.

The compressed read information 110e is expanded by the address expansion circuit 700 and transmitted to the circuit to be tested 100.

Thus, the compressed write information 110d and the compressed read information 110e are both transmitted via the first terminal group 130a. However, the compressed write information 110d is transmitted using L terminals whereas the compressed read information 110e is transmitted using a smaller number (L−K) of terminals.

This is possible because the compressed read information 110e is information consisting only of an address, and is easy to compress since a continuous address is usually referenced when reading, unlike when wilting. Therefore, the degree of compression of the read address can be set higher than the degree of compression of the write address/data 110f.

The controller 110*b* then receives a test result, that is specifically read data (of M bits) corresponding to the read address 110*g*, via the terminal group 130 (S2 in FIG. 5).

The controller 110*b* receives (M−K)-bit data of this M-bit read data using the second terminal group 130*b* (M−K terminals), while receiving the remaining K-bit data using the fourth terminal group 130*d* (K terminals) of the first terminal group 130*a*, that has not been used to transmit the compressed read information 110*e*.

The circuit testing system 140 is configured to use part of the transmitting terminals (the fourth terminal group 130*d*) for reception as well, by utilizing that the compressed read information 110*e* has a higher degree of compression than that of the compressed write information 110*d*, and thus the read address 110*g* can be transmitted using a smaller number of terminals than the number of terminals used for writing. Accordingly, the circuit testing system 140 enables further reduction of the testing terminals without depending-on a compression/expansion technique alone.

More specifically, in the circuit testing system 140, the total number of terminals in the terminal group 130 is L+M−K, and hence the number can be reduced by K in comparison with a case in which the transmitting terminals are not partially used for reception as well (in this case, the total number of terminals is L+M).

The reduction of the number of terminals makes it possible to reduce the testing time required for performing simultaneous parallel tests, and makes it possible to mount a chip in a less expensive package than conventional ones.

In the configuration described above, the read data is not compressed because it is assumed to be compared with an uncompressed expected value. If the data can be compared with a compressed expected value, however, it is obviously possible that the number of terminals can be further reduced by receiving the read data which has been compressed, and by using some of the transmitting terminals also for the reception.

These are the schematic description of the configuration of the circuit testing system 140 and the test method.

Next, the configuration of the circuit testing system 140 and the test method will be described with reference to FIGS. 6 to 11 based on a more specific example Firstly, a specific example of the configuration will be described with reference to FIG. 6.

It is assumed in the example described below that the circuit testing system 140 does not write and read simultaneously. It is also assumed that in order to read the read information burstily, the read address 110*g* (compressed read information 110*e*) is constantly being transmitted while receiving the read data at the same time.

Figure 6:
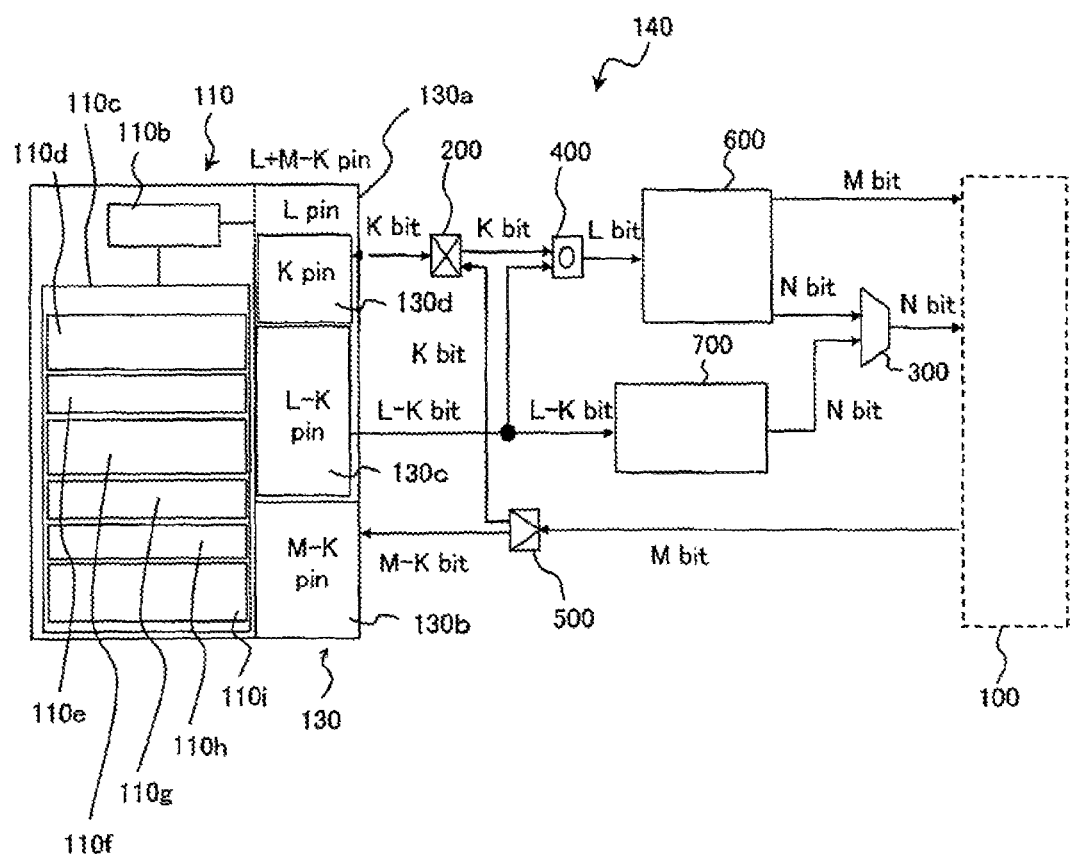
FIG. 6 is a block diagram specifically illustrating a configuration of the circuit testing system 140.

As shown in FIG. 6, the circuit testing system 140 comprises a circuit testing unit 110, an address expansion circuit 700, an address/data expansion circuit 600, and a terminal group 130.

The circuit testing system 140 further comprises a selection circuit 300 which receives input of a write address and a read address 110*g* and outputs these addresses to the circuit to be tested 100.

The circuit testing system 140 further comprises a dividing circuit 500 for dividing read data, a two-way switching circuit 200 for receiving input of part of the compressed write information 110*d* and part of the read data, and a coupling circuit 400 for coupling the compressed write information 110*d* input through the third terminal group 130*c* and the fourth terminal group 130*d*.

On the other hand, the circuit testing unit 110 comprises a controller 110*b* and a storage unit 110*c*. The storage unit 110*c* comprises the compressed write information 110*d*, the compressed read information 110*e*, the write address/data 110*f*, the read address 110*g*, compression rules 110*h* which are information indicating rules for compression of the write address/data 110*f*, and a test program 110*i* for conducting a test.

Description here will be made of an example of a test unit comprising the read address 110*g*, the write address/data 110*f*, the compression rules 110*h*, and the test program 110*i*. It is obvious that the invention is not limited to this example, and a method may be employed in which the compressed write information 110*d* and the compressed read information 110*e* are generated by a separate device such as a personal computer and the generated information is transferred to the storage unit 110*c*.

Next, a specific example of the test method will be described with reference to FIGS. 6 to 11.

Figure 7:
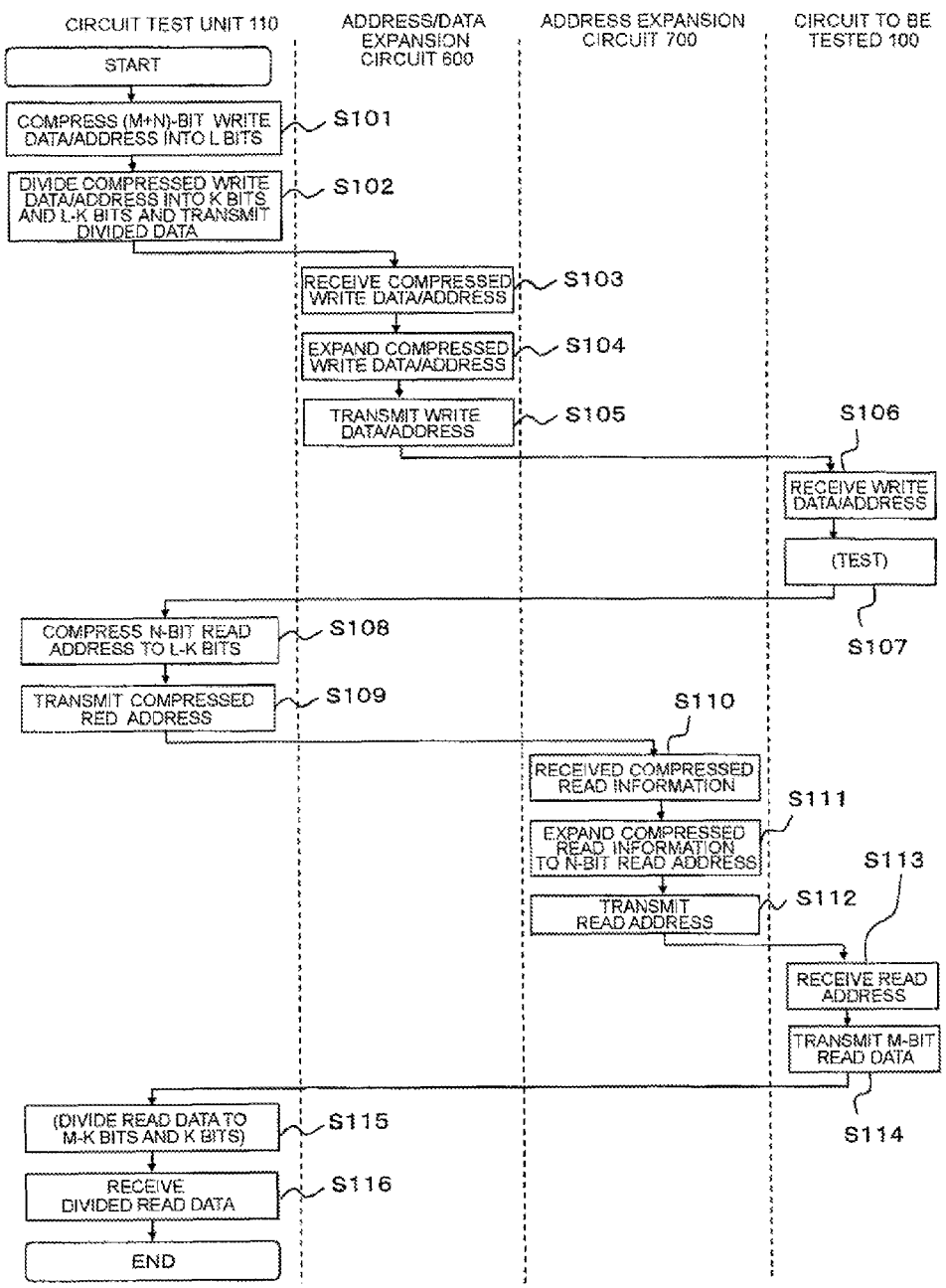
FIG. 7 is a flowchart specifically illustrating operation of the circuit testing system 140.

Firstly, the controller 110*b* of the circuit testing unit 110 starts the test program 110*i* so that the write address/data 110*f* is compressed into the compressed write information 110*d* using the compression rules 110*h* (S101 in FIG. 7).

It is assumed here that M-bit write address and N-bit write data are compressed into the L-bit compressed write information 110*d*.

A specific method of compressing the write address/data 110*f* will be described later.

The circuit testing unit 110 then divides the compressed write information 110*d* into K hits and L−K bits and transmits the divided information to the address/data expansion circuit 600 (S102 in FIG. 7).

More specifically, the controller 110*b* of the circuit testing unit 110 transmits the K-bit data to the two-way switching circuit 200 using the fourth terminal group 130*d* and transmits the (L−K)-bit data to the coupling circuit 400 using the third terminal group 130*c*. The two-way switching circuit 200 transmits the K-bit data to the coupling circuit 400, by which the K-bit data and the (L−K)-bit data are coupled together into L-bit data again, and the coupled data is transmitted to the address/data expansion circuit 600.

The address/data expansion circuit 600 then receives the L-bit compressed write information 110*d* (S103 in FIG. 7), and expands this to (N+M)-bit write address/data 110*f*.

Specifically, the address/data expansion circuit 600 expands the L-bit compressed write information 110*d* into an N-bit write address and M-bit write data according to expansion rules corresponding to the compression rules 110*h* (S104 in FIG. 7).

The address/data expansion circuit 600 then transmits the write address/data 110*f* to the circuit to be tested 100 (S105 in FIG. 7). More specifically, the write address is transmitted to the circuit to be tested 100 via the selection circuit 300, while the write data is transmitted directly to the circuit to be tested 100.

The circuit to be tested 100 receives the write address/data 110*f* (S106 in FIG. 7), and performs a predetermined test based on the received write address/data 110*f* (S107 in FIG. 7).

The circuit testing unit 110 then compresses the read address 110*g* that is information for requesting transmission of the test result (S108 in FIG. 7). It is assumed here that the N-bit read address 110*g* is compressed into (L−K)-bit compressed read information 110*e*.

Subsequently, the controller 110*b* of the circuit testing unit 110 transmits the compressed read information 110*e* to the address expansion circuit 700 via the third terminal group 130*c* (S109 in FIG. 7).

The address expansion circuit 700 receives the compressed read information 110e (S110 in FIG. 7), and expands this to N-bit read address 110g (S111 in FIG. 7). Any known compression technique such as run-length coding can be used to compress and expand the read address 110g.

The address expansion circuit 700 then transmits the read address 110g to the circuit to be tested 100 via the selection circuit 300 (S112 in FIG. 7).

The circuit to be tested 100 receives the read address 110g (S113 in FIG. 7), and transmits M-bit read data corresponding to the received read address 110g to the dividing circuit 500 (S114 in FIG. 7).

The M-bit read data is divided by the dividing circuit 500 into (M−K)-bit data and K-bit data (S115 in FIG. 7).

Finally, the controller 110b of the circuit testing unit 110 receives the divided pieces of the read data and couples them (S116 in FIG. 7). Specifically, the (M−K)-bit data is received via the second terminal group 130b and the K-bit data is received via the two-way switching circuit 200 and the fourth terminal group 130d, and the received (M−K)-bit data and K-bit data are coupled.

The foregoing is the description of the specific test method.

An example of a compression/expansion method of the write address/data 110f specialized in a reconfigurable device represented by an FPGA will be described with reference to FIGS. 8 to 11.

Figure 8:
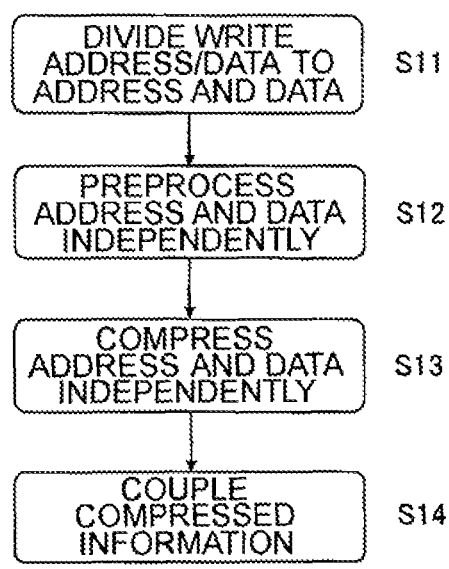
FIG. 8 is a flowchart illustrating procedures of compressing write address/data 110*f*.

Firstly, the compression will be schematically described with reference to FIG. 8. In FIG. 8, the reference codes indicated beside the arrows and composed of the letter "S" and figures each represent a step number. In this example, description will be made of operation in which configuration information comprising an address and data is input and compressed information thereof is output.

The term "address" as used herein means information corresponding to a location where information is to be stored, whereas the term "data" means an arbitrary value to be stored at this location. This means that, in a regular device, an address is composed of a sequence of values, while data assumes a value according to a format designated by the device.

As shown in FIG. 8, the circuit testing unit 110 performs compression according to the following procedure.

Step 11 (S11): Configuration information (write address/data 110f) is divided into an address and data;

Step 12 (S12): The divided address and data are independently subjected to preprocessing (to be described later in detail);

Step 13 (S13): The preprocessed address and data are independently compressed;

Step 14 (S14): The compressed address and data are coupled together and output as compressed write information 110d.

In step 12, the information is processed to be suitable for compression, which significantly contributes to improvement of compressibility. Further, it is made possible, in step 13, to select compression suitable for each of the address and the data comprising different attributes with different features, which significantly improves the compressibility.

Figure 9:
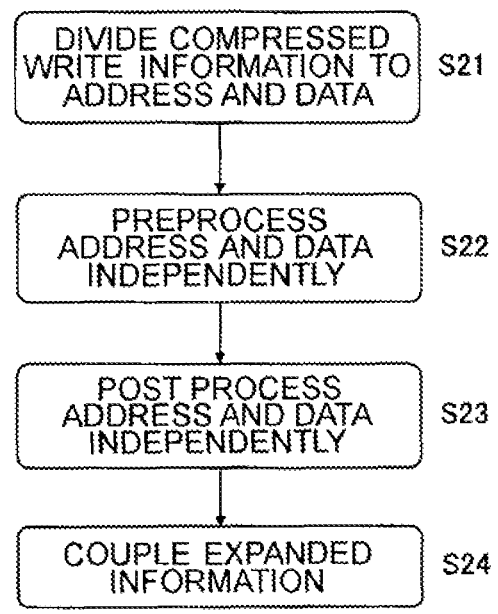
FIG. 9 is a flowchart illustrating procedures of expanding compressed write information 110*d*.

Next, expansion will be described schematically with reference to FIG. 9. In FIG. 9, the reference codes indicated beside the arrows and composed of the letter "S" and figures each represent a step number. In this example, description will be made of operation in which compressed write information 110d is input and expanded information thereof (write address/data 110f) is output.

Referring to FIG. 9, the address/data expansion circuit 600 performs expansion according to the following procedure.

Step 21 (S21): Configuration information (compressed write information 110d) is divided into a compressed address and compressed data;

Step 22 (S22): The divided compressed address and compressed data are expanded;

Step 23 (S23): The expanded address and data are subjected to postprocessing equivalent to inverse operation of step 12 of FIG. 8;

Step 24 (S24): The postprocessed address and data are coupled and output as write address/data 110f.

Since the address and the data can be independently expanded in step 22 and step 23, an advantage is provided that the expansion speed can be made very high.

Next, the respective procedure steps in FIGS. 8 and 9 will be described more specifically with reference to FIGS. 10 and 11.

Figure 10:
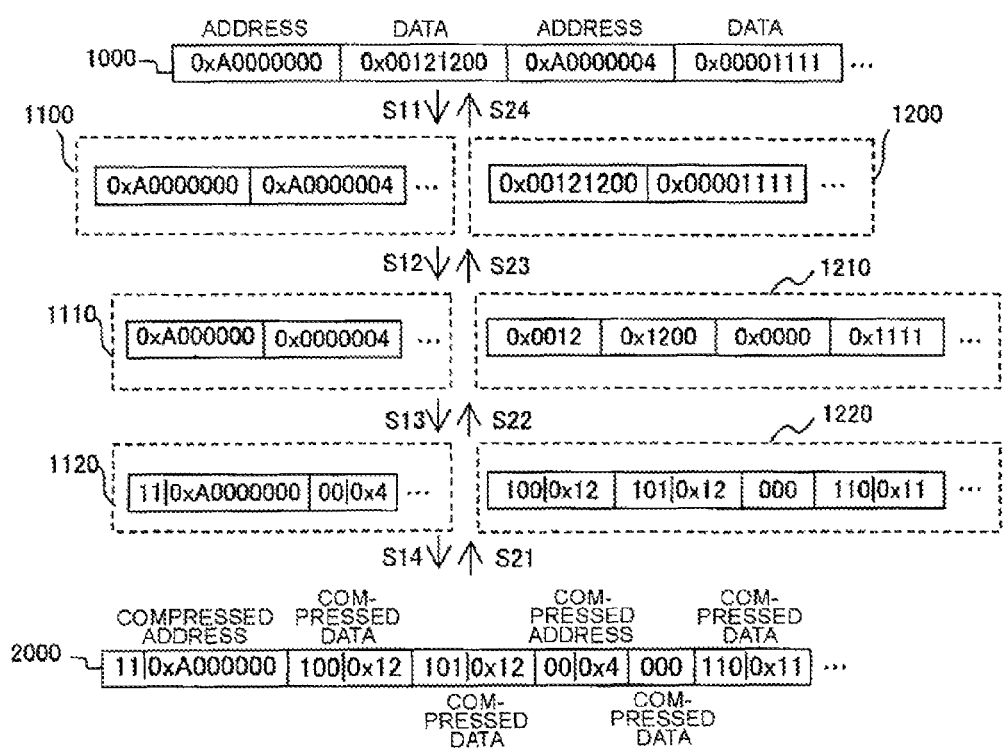
FIG. 10 is a diagram for explaining FIG. 8 and FIG. 9 using a specific example.

In FIG. 10, the reference codes indicated beside the arrows and composed of the letter "S" and figures represent the step numbers indicated in the FIGS. 8 and 9.

FIG. 10 shows, by way of example, configuration information 1000 (write address/data 1100, an address group 1100 and a data group 1200, a differential address group 1110 and a divided data group 1210, a compressed differential address group 1120 and a compressed divided data group 1220, and compressed configuration information 2000.

More specifically, information beginning with address "0xA0000000", data "0x00121200", address "0xA0000004", and data "0x00001111" is indicated as an example of the configuration information 1000. It should be understood that the relationship between address and data need not necessarily be one-to-one pair, but the configuration information 1000 may assume various other configurations such as one address followed by a plurality of pieces of data.

The address group 1100 is formed only of address information obtained by applying the procedure of step 11 in FIG. 8 to the configuration information 1000. In this example, the address group 1100 is formed of information beginning with address "0xA0000000" and address "0xA0000004". On the other hand, the data group 1200 is formed only of data information obtained by applying the procedure of step 11 in FIG. 8 to the configuration information 1000. In this example, the data group 1200 is formed of information beginning with data "0x00121200" and data "0x00001111".

The differential address group 1110 is formed of address information obtained by preprocessing the address group 1100 when address differentiation is selected as the preprocessing of step 12 in FIG. 8. In this example, the differential address group 1110 is formed of information beginning with address "0xA0000000" and address "0x0000004". This means that the address "0xA0000004" contained in the address group 1100 has been converted into the information "0x0000004" by removing the address "0xA0000000" directly before the same. Although address information in general has relatively continuous values, the address information never has different values from each other. Therefore, the address information is difficult to compress. The application of differentiation as preprocessing makes it possible to extract a large number of pieces of information comprising the same address difference, which enables significant improvement of compressibility.

The divided data group 1210 is formed of data information obtained by preprocessing the data group 1200 when it is selected as the preprocessing of step 12 in FIG. 8 to convert the data into 16-bit data. In this example, the divided data group 1210 is formed of 16-bit information beginning with data "0x0012", "0x1200", "0x0000", and "0x1111". The data information in general is information set by a reconfigurable device with a repeated configuration, and hence often assumes a value the minimum unit of which is a fractional bit. Therefore, the application of conversion into 16-bit data as the preprocessing makes it possible to extract a large number of pieces of information having the same value, and thus the compressibility can be improved significantly.

The compressed differential address group 1120 is formed of address information obtained by compressing the differential address group 1110 when address compression rules 3000 shown in FIG. 11 are selected as the compression method of step 13 in FIG. 8. In this example, the compressed differential address group 1120 is formed of address "0xA0000000" following a code of "0b11" (0b refers to a binary number), and information following a code of "0b00" and beginning with "0x4". Although the compression method using compression rules is not suitable for address information which often assumes successive values, the compressibility can be significantly improved by applying the compression method to the differential address group 1110. In step 24, inversely, the address information is made addable.

On the other hand, the compressed divided data group 1220 is formed of data information obtained by compressing the divided data group 1210 when data compression rules 3010 shown in FIG. 11 are selected as the compression method of step 13 in FIG. 8. In this example, the compressed divided data group 1220 is formed of data "0x12" following a code of "0b100", data "0x12" following a code of "0b101", a code of "0b000", a code of "0b000", and information following a code of "0b110" and beginning with "0x11". Originally, the compression method using compression rules requires a large number of rules in order to realize highly efficient compression when a number of bits is increased. However, the application of the divided data group 1210 in which data is divided makes it possible to improve the compressibility significantly with a less number of rules.

The compressed configuration information 2000 is formed of information obtained by coupling the compressed differential address group 1120 and the compressed divided data group 1220. In the compressed configuration information 2000, a compressed address and two pieces of compressed data respectively corresponding to the 32-bit address and 32-bit data in the uncompressed configuration information 1000 are sequentially output in pairs. It should be understood that this output sequence may be changed as desired.

All the types of information in FIG. 10 are shown by way of example only. The sequence of the address and data or bit information, and the sequence of compressed addresses and compressed data or bit information can be changed as desired.

FIG. 11 is a diagram for explaining an example of compression rules 110h according to an embodiment of this invention. In FIG. 11, the compression rules 110h comprises address compression rules 3000 and data compression rules 3010.

The address compression rules 3000 are composed of four rules. According to the address compression rules 3000, a code "0b00" and 4-bit data are output when data is 4-bit data without code extension, a code "0b01" and 8-bit data are output when data is 8-bit data without code extension, a code "0b10" and 16-bit data are output when data is 16-bit data without code extension, and a code "0b11" and 32-bit data are output when data is 32-bit data without code extension.

The data compression rules 3010 are composed of eight rules. In FIG. 11, symbols α and β each represent an arbitrary 4-bit data. According to the data compression rules 3010, only a code "0b000" is output when data is of all zero, a code "0b001" and 4-bit data are output when data is 4-bit data without code extension, a code "0b010" and 8-bit data are output when data is of "0x0α0β", a code "0b011" and 8-bit data are output when data is of "0xα0β0", a code "0b100" and 8-bit data are output when data is 8-bit data without code extension, a code "0b101" and 8-bit data are output when data is 8-bit zero padded data (0xαβ00), a code "0b110" and 8-bit data are output when data is (0xαβαβ) comprising equal high- and low-order bytes, and a code "0b111" and 16-bit data are output when data is 16-bit data without code extension.

As described above, the different compression rules each comprising a specific number of rules and contents of rules are applied to the address and the data information, respectively, which significantly contributes to improvement of compressibility.

The foregoing is an example of the method of compressing/expanding address and data.

Thus, according to this embodiment, the circuit testing system 140 is configured such that some of transmission terminals (second terminal group 130b) are used for reception as well.

This configuration enables further reduction of the number test terminals without depending on the compression/expansion technique alone.

The whole or part of the exemplary embodiment disclosed hereinabove can be described as, but not limited to, the following supplementary notes.

(Supplementary Note 1)

A semiconductor integrated circuit connected to a terminal group for exchange of test information of a circuit to be tested, and comprising a utilization device which utilizes, when reading a test result, a terminal subgroup in the terminal group, which is not used to transmit information required to read the test result, to receive the test result from the circuit to be tested.

(Supplementary Note 2)

The semiconductor integrated circuit according to Supplementary Note 1, wherein the utilization device is a dividing circuit for dividing a test result, and the dividing circuit utilizes the terminal subgroup assigned to reception of a test result to receive one part of the divided test result, and utilizes a terminal subgroup of the terminal group assigned to transmission of information required to read the test result and yet not utilized for transmission to received the other part of the test result.

(Supplementary Note 3)

The semiconductor integrated circuit according to either Supplementary Note 1 or 2, further comprising a first expansion circuit, wherein the first expansion circuit performs reading from the circuit to be tested by expanding information required to read the test result.

(Supplementary Note 4)

The semiconductor integrated circuit according to Supplementary Note 3, wherein the information required to read the test result is a read address of a read test, and the first expansion circuit receives the read address in its compressed form.

(Supplementary Note 5)

The semiconductor integrated circuit according to any of Supplementary Notes 1 to 4, further comprising a second expansion circuit, wherein the second expansion circuit performs writing to the circuit to be tested by expanding the information required to conduct the test.

(Supplementary Note 6)

The semiconductor integrated circuit according to Supplementary Note 5, wherein the information required to conduct the test is write data/address for a write test, and the second expansion circuit receives the write data/address in its compressed form.

(Supplementary Note 7)

The semiconductor integrated circuit according to Supplementary Note 6, wherein the second expansion circuit divides the compressed write data/address into compressed write data and compressed write address and expands the divided compressed write data and the divided compressed write address independently from each other.

(Supplementary Note 8)

The semiconductor integrated circuit according to Supplementary Note 7 wherein the second expansion circuit performs postprocessing independently on the write address and write data which have been independently expanded.

(Supplementary Note 9)

The semiconductor integrated circuit according to claim 8, wherein the postprocessing is processing to make the address information addable.

(Supplementary Note 10)

A circuit testing system comprising: a circuit testing unit comprising a first terminal group used to transmit information for requesting transmission of a test result of a circuit to be tested, a second terminal group used to receive the test result, and a controller for controlling exchange of the information using the first terminal group and the second terminal group; and a first expansion unit for receiving the information for requesting transmission of the test result via a third terminal group which forms part of the first terminal group, expanding the received information, and transmitting the expanded information to the circuit to be tested, the controller receiving the test result from the circuit to be tested via a fourth terminal group which is a terminal subgroup of the first terminal group not utilized by the first expansion unit.

(Supplementary Note 11)

The circuit testing system according to claim 10, further comprising a dividing device for dividing the test result, wherein the controller receives one part of the divided test result via the second terminal group, and receives the other part of the divided test result via the fourth terminal group.

(Supplementary Note 12)

The circuit testing system according to either claim 10 or 11, comprising a second expansion device for receiving information for testing a circuit to be tested via the first terminal group, expanding the received information and transmitting the expanded information to the circuit to be tested.

(Supplementary Note 13)

A circuit testing unit comprising: a first terminal group used to transmit result request information for requesting a test result of a circuit to be tested; a second terminal group used to receive the test result of the circuit to be tested; and a controller for receiving the test result from the circuit to be tested via the terminal subgroup of the first terminal group which is not utilized to transmit the result request information.

(Supplementary Note 14)

The circuit testing unit according to claim 13, wherein: the controller utilizes a third terminal group which is part of the first terminal group to transmit the result request information; and the controller receives part of the test result via the second terminal group, and receives the remaining part of the test result via a fourth terminal group which is formed of the terminals other than those of the third terminal group in the first terminal group.

(Supplementary Note 15)

The circuit testing unit according to either claim 13 or 14, wherein the first terminal group is also used to transmit testing information which is information obtained by compressing write data/address of a write test.

(Supplementary Note 16)

The circuit testing unit according to claim 15, wherein when compressing the write data/address, the controller divides the write data/address into write data and write address, compresses the divided write data and write address independently, and couples the compressed write data and the compressed write address.

(Supplementary Note 17)

A circuit test method characterized by using in common a first terminal group used to transmit result request information requesting a test result of a circuit to be tested and a second terminal group used to receive the test result of the circuit to be tested, and utilizing a terminal subgroup of the first terminal group, which is not been utilized to transmit the result request information, to receive the test result from the circuit to be tested.

(Supplementary Note 18)

The circuit test method according to claim 17, characterized by: utilizing a third terminal group which is part of the first terminal group is utilized to transmit the result request information; dividing the test result; utilizing the second terminal group to receive part of the test result; and utilizing a fourth terminal group formed of the terminals other than those of the third terminal group in the first, terminal group to receive the remaining part of the test result.

(Supplementary Note 19)

The circuit test method according to either claim 17 or 18, characterized by using the first terminal group to transmit the testing information as well.

The foregoing description of the embodiments has been made using an example in which this invention is applied to a case in which a reconfigurable device represented by a FPGA is used as a circuit to be tested, and configuration information is used as information transmitted by the circuit testing unit. However, this invention is not limited to this.

Specifically, a circuit testing unit is required to perform both reading and writing on a circuit to be tested, and therefore, this invention is not limited to such a circuit to be tested.

Further, although the read data is not compressed in the aforementioned embodiment, it is also possible, if the read data can be compared with uncompressed expected value, to compress the read data, reduce the total number of output terminals for outputting the read data, and use these output terminals in common with write data terminals (first terminal group 130*a*).

This application is based upon and claims the benefit of priority from Japanese Patent Application No. 2009-122048 filed May 20, 2009, the disclosure of which is incorporated herein in its entirety by reference.

The invention claimed is:

1. A semiconductor integrated circuit connected to a terminal group for exchange of test information of a circuit to be tested, and comprising a utilization device which utilizes, when reading a test result, a terminal subgroup in the terminal group, which is not used to transmit information required to read the test result, to receive the test result from the circuit to be tested, wherein the utilization device is a dividing circuit for dividing a test result, and the dividing circuit utilizes the terminal subgroup assigned to reception of a test result to receive one part of the divided test result, and utilizes a terminal subgroup of the terminal group assigned to transmission of information required to read the test result and yet not utilized for receiving the other part of the test result.

2. The semiconductor integrated circuit according to claim 1, further comprising a first expansion circuit, wherein the first expansion circuit performs reading from the circuit to be tested by expanding information required to read the test result.

3. The semiconductor integrated circuit according to claim 2, wherein the information required to read the test result is a read address of a read test, and the first expansion circuit receives the read address in its compressed form.

4. The semiconductor integrated circuit according to claim 1, further comprising a second expansion circuit, wherein the second expansion circuit performs writing to the circuit to be tested by expanding the information required to conduct the test.

5. The semiconductor integrated circuit according to claim 4, wherein the information required to conduct the test is write data/address for a write test, and the second expansion circuit receives the write data/address in its compressed form.

6. The semiconductor integrated circuit according to claim 5, wherein the second expansion circuit divides the compressed write data/address into compressed write data and compressed write address and expands the divided compressed write data and the divided compressed write address independently from each other.

7. A circuit testing system comprising:
a circuit testing unit comprising a first terminal group used to transmit information for requesting transmission of a test result of a circuit to be tested, a second terminal group used to receive the test result, and a controller for controlling exchange of the information using the first terminal group and the second terminal group; and
a first expansion unit for receiving the information for requesting transmission of the test result via a third terminal group which forms part of the first terminal group, expanding the received information, and transmitting the expanded information to the circuit to be tested, the controller receiving the test result from the circuit to be tested via a fourth terminal group which is a terminal subgroup of the first terminal group which is not utilized by the first expansion unit.

8. The semiconductor integrated circuit according to claim 7, wherein the postprocessing is processing to make the address information addable.

9. A circuit testing system comprising:
a circuit testing unit comprising a first terminal group used to transmit information for requesting transmission of a test result of a circuit to be tested, a second terminal group used to receive the test result, and a controller for controlling exchange of the information using the first terminal group and the second terminal group; and
a first expansion unit for receiving the information for requesting transmission of the test result via a third terminal group which forms part of the first terminal group, expanding the received information, and transmitting the expanded information to the circuit to be tested,
the controller receiving the test result from the circuit to be tested via a fourth terminal group which is a terminal subgroup of the first terminal group not utilized by the first expansion unit.

10. The circuit testing system according to claim 9, further comprising a dividing device for dividing the test result, wherein the controller receives one part of the divided test result via the second terminal group, and receives the other part of the divided test result via the fourth terminal group.

11. The circuit testing system according to claim 9, comprising a second expansion device for receiving information for testing a circuit to be tested via the first terminal group, expanding the received information and transmitting the expanded information to the circuit to be tested.

12. A circuit testing unit comprising:
a first terminal group used to transmit result request information for requesting a test result of a circuit to be tested;
a second terminal group used to receive the test result of the circuit to be tested;
a dividing device for dividing a test result; and
a controller for receiving one part of the test result divided by the dividing device from the circuit to be tested via a terminal subgroup of the first terminal group which is not utilized to transmit the result request information, wherein the dividing device utilizes the terminal subgroup assigned to reception of a test result to receive one part of the divided test result, and utilizes a terminal subgroup of the terminal group assigned to transmission of information required to read the test result and vet not utilized for receiving the other part of the test result.

13. The circuit testing unit according to claim 12, wherein:
the controller utilizes a third terminal group which is part of the first terminal group to transmit the result request information; and
the controller receives part of the test result via the second terminal group, and receives the remaining part of the test result via a fourth terminal group which is formed of the terminals other than those of the third terminal group in the first terminal group.

* * * * *